United States Patent
Tixhon et al.

(10) Patent No.: US 7,776,460 B2
(45) Date of Patent: *Aug. 17, 2010

(54) COATED SUBSTRATE WITH HIGH REFLECTANCE

(75) Inventors: Eric Tixhon, Jumet (BE); Philippe Legrand, Jumet (BE)

(73) Assignee: AGC Glass Europe, Brussels (BE)

( * ) Notice: Subject to any disclaimer, the term of this patent is extended or adjusted under 35 U.S.C. 154(b) by 0 days.

This patent is subject to a terminal disclaimer.

(21) Appl. No.: 11/923,809

(22) Filed: Oct. 25, 2007

(65) Prior Publication Data

US 2008/0050569 A1 Feb. 28, 2008

Related U.S. Application Data

(63) Continuation-in-part of application No. 11/668,149, filed on Jan. 29, 2007, which is a continuation of application No. 10/979,099, filed on Nov. 2, 2004, now Pat. No. 7,195,821, which is a continuation of application No. 10/177,015, filed on Jun. 24, 2002, now Pat. No. 6,881,505, which is a continuation-in-part of application No. 09/423,337, filed as application No. PCT/BE99/00036 on Mar. 17, 1999, now Pat. No. 6,423,414.

(30) Foreign Application Priority Data

Mar. 20, 1998 (GB) .................. 9806027.0

(51) Int. Cl.
 *B32B 9/00* (2006.01)
 *B32B 17/06* (2006.01)
(52) U.S. Cl. ................... 428/701; 428/432; 428/702; 428/699; 428/336

(58) Field of Classification Search .................. None
 See application file for complete search history.

(56) References Cited

U.S. PATENT DOCUMENTS

| 3,531,313 | A |   | 9/1970 | Dates |
|---|---|---|---|---|
| 4,828,880 | A | * | 5/1989 | Jenkins et al. ............ 427/167 |
| 4,900,634 | A |   | 2/1990 | Terneu et al. |
| 5,780,149 | A |   | 7/1998 | McCurdy et al. |
| 5,938,810 | A | * | 8/1999 | De Vries et al. ............ 65/268 |
| 6,027,766 | A |   | 2/2000 | Greenberg et al. |
| 6,071,606 | A |   | 6/2000 | Yamazaki et al. |

FOREIGN PATENT DOCUMENTS

| EP | 0 275 | 7/1988 |
|---|---|---|
| FR | 2 648 453 | 12/1990 |
| FR | 2 348 166 | 11/1997 |
| GB | 1 455 148 | 11/1976 |
| GB | 2 078 213 | 1/1982 |
| GB | 2 200 139 | 7/1988 |
| GB | 2 302 101 | 1/1997 |
| GB | 2 302 102 | 1/1997 |
| JP | 08 073242 A | 3/1996 |
| WO | 97/25287 | 7/1997 |

* cited by examiner

*Primary Examiner*—Ling Xu
(74) *Attorney, Agent, or Firm*—Oblon, Spivak, McClelland, Maier & Neustadt, L.L.P.

(57) ABSTRACT

A transparent coated substrate with high reflectance, especially for use as in exterior glazing panels for buildings, is provided by a substrate carrying a coating stack comprising a pyrolytically-formed main layer containing oxides of tin and antimony, in which the main layer has a geometric thickness of at least 250 nm and the stack includes an outer reflective layer having a geometric thickness in the range 30 to 150 nm and a refractive index in the range 2.0 to 2.8, whereby the so-coated substrate has a reflectance (RL) of more than 10%.

40 Claims, No Drawings

COATED SUBSTRATE WITH HIGH REFLECTANCE

CROSS-REFERENCE TO RELATED APPLICATIONS

This application is a continuation-in-part of U.S. application Ser. No. 11/668,149, filed 29 Jan. 2007, which is a continuation of U.S. application Ser. No. 10/979,099, filed 2 Nov. 2004, which is a continuation of U.S. application Ser. No. 10/177,015 filed 24 Jun. 2002, which is a continuation-in-part of U.S. application Ser. No. 09/423,337 having a 35 U.S.C. §371 date of 22 Nov. 1999, said U.S. application Ser. No. 09/423,337 being the U.S. National Stage Entry of International Application PCT/BE99/00036 filed 17 Mar. 1999 which claims priority of United Kingdom Application No. 98 06027.0 filed 20 Mar. 1998, the disclosures of all of which are hereby incorporated by reference, and as to common subject matter the priorities of all of which are hereby claimed.

BACKGROUND OF THE INVENTION

1. Field of the Invention

The present invention relates to a coated substrate with high reflectance. It is especially concerned with transparent glass substrates bearing a coating of oxides of tin and antimony and with the use of such substrates in exterior glazing panels for buildings.

2. Description of the Related Art

Although architects seeking glazing panels for use in buildings have traditionally tended to favour panels with low levels of reflection, a changing perception of the aesthetic appeal has led to increasing demands for panels with higher levels of reflection but without the glare as viewed from outside which is associated with very high levels of reflection. The panels may also be required to have other qualities such as providing protection for occupants of the building against solar radiation and the associated overheating (solar screening properties).

The panels comprise at least one sheet of a transparent substrate material, typically soda-lime glass, with a thin coating on one or more of the sheet faces to modify the optical and physical properties of the sheet and the panel as a whole. A huge variety of prior proposals have been made for the coating, according to the specific properties sought. The coating may comprise a stack of several discrete layers chosen with appropriate compositions and thicknesses to complement their respective effects. A persistent problem in choosing the respective layers is that a layer adopted for one purpose may adversely change the effect of other layers.

Tin oxide ($SnO_2$) has been widely used as a coating material, often in combination with other metal oxides. Coatings comprising tin oxide with a small proportion of antimony oxide have proved especially attractive.

Our GB patent 1455148 teaches a method for pyrolytically forming a coating of one or more oxides (e.g. $ZrO_2$, $SnO_2$, $Sb_2O_3$, $TiO_2$, $Co_3O_4$, $Cr_2O_3$, $SiO_2$) on a substrate, primarily by spraying compounds of a metal or silicon, so as to modify the light transmission and/or light reflection of the substrate. Our GB patent 2078213, which relates to a method for pyrolytically forming a coating by two separate sprays to achieve high rates of coating build-up, discloses tin oxide coatings doped with fluorine or antimony. Our GB patent 2200139 relates to forming a pyrolytic tin oxide coating from a precursor containing at least two additives such as oxidising agents, sources of fluorine and sources of metal.

The use of a tin oxide coating with a small proportion of antimony oxide has been found to offer several advantageous combinations of optical and energy properties. Our GB patent applications 2302101 ('101) and 2302102 ('102) describe anti-solar glazing panels comprising a pyrolytic coating layer of oxides of tin and antimony in which the Sb/Sn molar ratio is from 0.01 to 0.5. The '101 coating is applied by liquid spray and has a thickness of at least 400 nm, a luminous transmittance of less than 35% and a selectivity of at least 1.3. The '102 coating is applied by chemical vapour deposition (CVD) and has a solar factor below 70%.

The use of pyrolysis to form a coating on a substrate generally has the advantage of producing a hard coating with durable abrasion-resistant and corrosion-resistant properties. It is believed that this is due in particular to the fact the process involves deposition of coating material on to a substrate which is hot. Pyrolysis is also generally cheaper than alternative coating processes such as sputtering, particularly in terms of the investment in plant.

Properties of the coated substrate discussed herein are based on the standard definitions of the International Commission on Illumination—Commission Internationale de l'Eclairage ("CIE"). The illuminant for the tests was illuminant C, which represents average daylight having a colour temperature of 6700 K and is especially useful for evaluating the optical properties of glass intended for use in buildings.

The "luminous transmittance" (TL) is the luminous flux transmitted through a substrate as a percentage of the incident luminous flux.

The "luminous reflectance" (RL) is the luminous flux reflected from a substrate as a percentage of the incident luminous flux.

The "purity" (p) of the colour of the substrate refers to the excitation purity in transmission or reflection.

The "dominant wavelength" ($\lambda_D$) is the peak wavelength in the transmitted or reflected range.

The "solar factor" (FS), referring to the transmission of total incident solar radiation through the coated substrate, is the sum of the total energy directly transmitted (TE) and the energy which is absorbed and re-radiated on the side of the coated substrate away from the energy source, as a proportion of the total incident radiant energy.

The "selectivity" of a coated substrate for use in a building glazing panel is the ratio of the luminous transmittance to the solar factor (TL/FS).

It is an object of the present invention to provide a pyrolytically formed coating on a substrate to impart solar screening properties and a high reflectance to the substrate.

SUMMARY OF THE INVENTION

We have discovered that this and other useful objectives can be achieved by depositing a coating stack comprising a defined overcoat layer on a main layer comprising tin and antimony oxides.

According to the invention there is provided a transparent substrate carrying a coating stack comprising a pyrolytically-formed main layer containing oxides of tin and antimony, characterised in that the main layer has a geometric thickness of at least 250 nm and in that the stack includes an outer reflective layer having a geometric thickness in the range 30 to 150 nm and having a refractive index in the range 2.0 to 2.8, whereby the so-coated substrate has a reflectance (RL) of more than 10%.

DESCRIPTION OF THE PREFERRED EMBODIMENTS

The presence of the outer reflective layer creates an improvement in the luminous reflectance (RL) of the coated substrate, increasing the reflectance from less than 10% to more than 10%, and generally to at least 15% and even to around 25%. Moreover these increases are achieved without taking the other optical properties of the substrate beyond acceptable limits. The outer layer is also beneficial in further improving the abrasion and corrosion resistance of the coating.

Although the invention is described herein primarily with reference to glazing panels for buildings, panels according to the invention are suitable for other applications such as vehicle windows, in particular vehicle sunroofs.

Preferably the outer reflective layer contains an oxide of one or more of nickel, tin, titanium, zinc and zirconium. These materials readily form by pyrolysis a coating with the required refractive index.

The outer reflective layer preferably comprises oxide of titanium. This gives a high luminous reflectance for a very thin coating thickness. Preferably, the coating contains oxide of titanium together with oxide of tin. This confers to the coating a better abrasion and chemical resistance. Such a coating contains most preferably at least 50% by volume of tin oxide and at least 30% by volume of titanium oxide. The preferred geometric thickness for a titanium oxide coating is in the range 45-55 nm. The preferred geometric thickness for tin/titanium oxide reflective layer is in the range 40 to 75 nm. Below 40 nm the layer may not be sufficient to modify the optical properties, especially the reflectance, of the coated product. Above 75 nm the level of luminous reflection may be unduly high and the optical effects of the overcoat will tend to mask the optical effects of the other layers in the stack. More preferably the said layer has a thickness in the range 60 to 75 nm. This range permits the attainment of good optical stability for the coating stack. Optical stability means that variations of the thickness of the layer, inherent in industrial production, do not cause significant changes of the optical properties, particularly of Hunter values a and b and purity in reflection. Optical stability is even better when the overcoat has a thickness between 60 and 70 nm.

The Sb/Sn oxide materials of the main layer impart good anti-solar properties to the coated substrate. The geometric thickness of at least 250 nm for this layer represents the optimum range for a layer in terms of providing solar screening properties sought after and a neutral tint. Preferably the said thickness is lower than 650 nm, for economic and practical reasons. Most preferably, the thickness is in the range 300 to 360 nm. Such a range permits the attainment of coated products with sufficient solar screening properties and presenting optical stability.

Preferably the coated product has a Hunter value a between 0 to −2, and Hunter value b between −4 and −2, thus meaning a slightly bluish aspect in reflection. Purity in reflection is preferably low, i.e. less than 10%, preferably between 4 and 7.5.

As taught in our earlier patent specification GB-A-2302102 the Sb/Sn molar ratio in the main coating layer is preferably in the range 0.01 to 0.5, more preferably in the range 0.03 to 0.21.

As described and claimed in our copending patent application of the same date as the present application, the reflectance of the coated substrate may be further improved by also including in the main coating layer an additive comprising one or more of aluminium, chromium, cobalt, iron, manganese, magnesium, nickel, titanium, vanadium, zinc and zirconium. The said additive is preferably selected from chromium, iron and magnesium.

In one embodiment of the invention the coating stack further comprises an undercoat positioned between the substrate and the main coating layer. The undercoat serves to improve the aesthetic appeal of the coating both by reducing or eliminating haze in the coating stack and by neutralising the colour that the tin oxide in the main layer tends to impart to the stack.

Suitable materials for the undercoat include one or more silicon oxide or alumina-based coating, for example alumina with a small proportion of vanadium oxide. In the case of silicon oxides it is preferred to use an incompletely oxidised material, i.e. $SiO_x$ where x is less than 2, which may have the general structure of $SiO_2$ but has a proportion of gaps which would be filled with oxygen in the dioxide. This can be achieved by employing oxygen in an insufficient quantity for full oxidation of the undercoat material on the substrate.

The preferred geometric thickness of the undercoat is in the range 60 to 75 nm. This is the range in which the undercoat tends best to impart to the coating stack a neutral tint in reflection.

In a further embodiment of the invention the coating stack also comprises an intermediate layer positioned between the main coating layer and the outer reflective layer. This intermediate layer is a further means of increasing the luminous reflectance of the coated substrate. Suitable materials for the intermediate layer include oxides of aluminium or silicon, which may be used alone or in admixture.

Because the presence of fluorine tends to hinder the incorporation of certain elements such as antimony into the coating layers it is desirable that fluorine be excluded from the coating layers of the invention.

Preferably, as discussed above, the reflectance (RL) of the coated substrate is at least 15% but not so great as to create glare in reflection. Thus it is preferred that the coated substrate has a maximum reflectance (RL) of 25%, most preferably a maximum reflectance of 20%.

It is mostly required that the glazing panel shall transmit a sufficient proportion of visible light in order to allow both good natural illumination inwards into the building or vehicle and good visibility outwards. The light transmittance (TL) of a coated substrate according to the invention is preferably greater than 60%.

It is desirable to increase to a high level the selectivity of the coating, i.e. the ratio of the transmittance to the solar factor. It is preferred that the selectivity is greater than 1.00.

The invention includes within its scope a glazing panel comprising a coated transparent substrate as defined herein. The panel may be a single sheet or alternatively may include two or more substrate sheets in a multiple-glazed or laminated assembly. In a multiple glazing or laminated assembly it is preferred that just one of the constituent sheets carries the coating.

Pyrolytic methods are generally preferred for the application of all the layers of the coating stack of the invention. Coatings produced by pyrolysis are generally advantageous in having a greater mechanical resistance than coatings produced by other methods. The reactant materials to be pyrolysed may be applied to the substrate by chemical vapour deposition (CVD or "vapour pyrolysis") or as a liquid spray ("liquid pyrolysis").

Application of a pyrolytic coating to flat glass is best achieved when the glass is newly formed, e.g. as it leaves a float glass line. This provides economic benefits in avoiding the need to reheat the glass for the pyrolytic reactions to take place, and in the quality of the coating, since the newly formed glass surface is in pristine condition.

Preferably the source of tin for the main layer is selected from $SnCl_2$, $SnCl_4$, $Sn(CH_3)_2Cl_2$, tetramethyl tin or monobutyl trichloro tin ("MBTC"). The source of antimony for the main layer may be selected from $SbCl_5$, $SbCl_3$, organo antimony compounds such as $Sb(OCH_2CH_3)_3$, $Cl_{1.7}Sb(OCH_2CH_3)_{1.3}$, $Cl_2SbOCHClCH_3$, $Cl_2SbOCH_2CHCH_3Cl$ and $Cl_2SbOCH_2C(CH_3)_2Cl$. The source of any metallic additive for the main layer may similarly be a suitable chloride or organo-metallic compound of the respective metal.

The sources of reactants for the respective layers are preferably formed into single starting mixtures for each of the layers, whereby all of the starting reactants for a given layer are applied simultaneously to the substrate.

To form a coating layer by CVD, the respective reactant mixture is applied, typically through a nozzle, to the substrate in a coating chamber. Where this mixture comprises chlorides which are liquid at ambient temperature, it is vaporised in a heated current of anhydrous carrier gas such as nitrogen. Vaporisation is facilitated by the atomization of these reagents in the carrier gas. To produce the oxides, the chlorides are brought into the presence of a source of oxygen, for instance, water vapour.

Methods and devices for forming such a coating are described for example in French patent No 2348166 or in French patent application No 2648453. These methods and devices lead to the formation of particularly strong coatings with advantageous optical properties.

To form the coating by a spray method, the substrate may be brought into contact with a spray of droplets containing the respective reactant materials. The spray is applied by one or more spray nozzles arranged to follow a path which provides the coating across the width of the ribbon to be coated.

CVD offers benefits over sprayed liquids in providing coatings of regular thickness and composition, such uniformity of the coating being important where the product is to cover a large area. A spray coating also tends to retain traces of the sprayed droplets and of the path of the spray gun. Moreover, the pyrolysis of sprayed liquids is essentially limited to the manufacture of oxide coatings, such as $SnO_2$ and $TiO_2$. It is also difficult to make multi-layer coatings using sprayed liquids because every coating deposition produces a significant cooling of the substrate. Furthermore, CVD is more economic in terms of raw materials, leading to lower wastage.

However despite such disadvantages of the spray method it is nevertheless convenient and inexpensive to apply and employs simple equipment. It is thus often adopted, especially for formation of thick coating layers.

Glazing panels incorporating coated substrates according to the invention may be manufactured as follows. Each pyrolytic coating step may be carried out at a temperature of at least 400° C., ideally from 550° C. to 750° C. The coatings can be formed on a sheet of glass which moves in a tunnel oven or on a glass ribbon during formation, whilst it is still hot. The coatings can be formed inside the lehr which follows the glass ribbon forming device or inside the float tank on the top face of the glass ribbon whilst the latter is floating on a bath of molten tin.

The invention is further described below with reference to the following non-limiting examples.

Example 1

A coating stack was applied to clear soda-lime float glass of 6 mm thickness at a series of coating stations each located at a position in a float chamber where the glass was at an elevated temperature. An undercoat comprising oxides of aluminium and vanadium was first applied by spraying on to the glass, which at this initial stage was at a temperature in excess of 550° C., a solution in glacial acetic acid of 220 g/l aluminium acetylacetonate and 12 g/l vanadium triacetylacetonate to form a layer of about 75 nm geometric thickness. Next a main layer, comprising oxides of tin and antimony, was applied by spraying on to the glass, at a temperature of about 550° C., a solution comprising $SnCl_2$ and $SbCl_3$. The proportions of Sn and Sb gave an Sb/Sn ratio in the layer of 0.05 and the formed layer thickness was 430 nm. Finally an overcoat layer comprising oxides of tin and titanium was applied by spraying a solution in dimethylformamide comprising tin dibutylacetate and a titanium chelate formed from octylene glycol titanate and acetylacetone. The overcoat contained 60% $SnO_2$ by volume and 40% $TiO_2$ by volume and had a geometric thickness of 70 nm.

The thus-coated substrate was placed in a frame to form a glazing panel with the coating stack facing outwards. The optical properties of the substrate were measured from the external side.

The properties of the glazing panel were as shown in the accompanying Table.

Examples 2 to 11

A coating stack was applied to clear soda-lime float glass of 6 mm thickness at a series of coating stations each located at a position in a float chamber where the glass was at an elevated temperature. An undercoat silicon oxide SiOx was first applied in a coating station located at a position along the float chamber where the glass was at a temperature of about 700° C. The supply line was fed with nitrogen, silane was introduced thereto with a partial pressure of 0.2%, and oxygen was introduced with a partial pressure of 0.36%. A coating of SiOx, where x was approximately equal to 1.78, was obtained with a refractive index of about 1.69. The layer had a geometric thickness as specified in the table. Next a main layer, comprising oxides of tin and antimony, was applied by CVD pyrolysis, using a vaporised reactant mixture of MBTC as the source of tin and $SbCl_3$ as the source of antimony. A tin/antimony oxide coating layer containing tin and antimony in an Sb/Sn molar ratio of 0.05 was formed, in a thickness as specified in the table.

Finally an overcoat layer comprising oxides of tin and titanium was applied by spraying a solution in dimethylformamide comprising tin dibutylacetate and a titanium chelate formed from octylene glycol titanate and acetylacetone. The overcoat contained 60% $SnO_2$ by volume and 40% $TiO_2$ by volume and had a geometric thickness as specified in the table.

The thus-coated substrate was placed in a frame to form a glazing panel with the coating stack facing outwards. The optical properties of the substrate were measured from the external side.

Examples 12 to 19

The procedure of examples 12 to 19 was the same as for examples 2 to 11, except that the overcoat layer was made of pure $TiO_2$, starting from titanium chelate formed from octylene glycol titanate and acetylacetone. In examples 16 to 19, the tin/antimony oxide coating layer contains tin and antimony in a Sb/Sn molar ratio of 0.1.

Comparative Examples C.1 to C.10

A coated substrate was prepared as described in Example 2 to 19 but with the difference that no overcoat was applied to the main layer. In comparative examples C1 to C8, the molar ration Sb/Sn in the tin/antimony coating layer was 0.05. In comparative examples C9 and C10, this molar ratio is 0.1.

The properties of the so-formed glazing panel are again shown in the accompanying Table.

Comparison of the results shows a significant improvement in the luminous reflectance of the panel, from less than 10% to more than 24% with a pure $TiO_2$ overcoat. The improvement was accompanied by some reduction in luminous transmittance but this was still within acceptable limits.

TABLE

|  | Examples | | | | | | | | | | |
|---|---|---|---|---|---|---|---|---|---|---|---|
|  | 1 | 2 | 3 | 4 | 5 | 6 | 7 | 8 | 9 | 10 | 11 |
| Undercoat thickness (nm) | 75 | 62.5 | 62.5 | 67.5 | 67.5 | 72.5 | 62.5 | 62.5 | 67.5 | 67.5 | 60 |
| Main layer thickness (nm) | 430 | 342.5 | 342.5 | 342.5 | 342.5 | 342.5 | 347.5 | 347.5 | 347.5 | 347.5 | 350 |
| Overcoat thickness (nm) | 70 | 64 | 68 | 64 | 68 | 62 | 64 | 68 | 64 | 68 | 69 |
| Luminous reflectance (RL) (%) | 21.7 | 18.4 | 18.4 | 18.6 | 18.6 | 18.7 | 18.4 | 18.5 | 18.6 | 18.6 | 18.4 |
| Hunter value in reflection a | 0.1 | 0.44 | −0.53 | −0.2 | −0.95 | −0.3 | −0.62 | −1.61 | −1 | −1.8 | −2.3 |
| Hunter value in reflection b | −2.6 | −3.84 | −2.3 | −3.5 | −2.07 | −3.9 | −3.64 | −2.04 | −3.42 | −1.93 | −1.5 |
| Colour purity in reflection (%) | 4.2 | 6.5 | 4.6 | 6.4 | 4.6 | 7.1 | 7 | 5.1 | 6.9 | 5 | 4.8 |
| $\lambda_D$ in reflection (nm) | 488 | 475 | 480 | 478 | 483 | 478 | 480 | 485 | 481 | 486 | 488 |
| Luminous transmittance (TL) (%) | 42.3 | 64.8 | 64.8 | 64.7 | 64.7 | 64.6 | 64.7 | 64.65 | 64.6 | 64.5 | 64.6 |
| Solar factor (FS) (%) | 42.6 | 59 | 58.8 | 59 | 58.9 | 59.1 | 58.8 | 58.6 | 58.8 | 58.7 | 58.5 |
| Selectivity (TL/FS) | 0.99 | 1.10 | 1.10 | 1.10 | 1.10 | 1.10 | 1.10 | 1.10 | 1.10 | 1.10 | 1.10 |

|  | Comparative examples | | | | | |
|---|---|---|---|---|---|---|
|  | C1 | C2 | C3 | C4 | C5 | C6 |
| Undercoat thickness (nm) | 62.5 | 67.5 | 72.5 | 62.5 | 67.5 | 60 |
| Main layer thickness (nm) | 342.5 | 342.5 | 342.5 | 347.5 | 347.5 | 350 |
| Luminous reflectance (RL) (%) | 12.7 | 12.5 | 12.3 | 12.7 | 12.5 | 12.8 |
| Hunter value in reflection a | −2.4 | −1.5 | −0.82 | −1.4 | −0.75 | −1.2 |
| Hunter value in reflection b | 2.3 | 1.4 | 0.63 | 2.2 | 1.4 | 2.4 |
| Colour purity in reflection (%) | 4.8 | 3 | 1.2 | 5 | 3.3 | 5.7 |
| $\lambda_D$ in reflection (nm) | 559 | 559 | 552 | 567 | 569 | 569 |
| Luminous transmittance (TL) (%) | 69.9 | 70.1 | 70.2 | 69.7 | 69.9 | 69.6 |
| Solar factor (FS) (%) | 65.4 | 65.4 | 65.3 | 65.2 | 65.2 | 65.1 |
| Selectivity (TL/FS) | 1.07 | 1.07 | 1.08 | 1.07 | 1.07 | 1.07 |

|  | Examples | | | | | | | |
|---|---|---|---|---|---|---|---|---|
|  | 12 | 13 | 14 | 15 | 16 | 17 | 18 | 19 |
| Undercoat thickness (nm) | 70 | 70 | 70 | 70 | 70 | 70 | 70 | 70 |
| Main layer thickness (nm) | 300 | 291.8 | 413.6 | 393.3 | 313.3 | 292.4 | 391.2 | 400 |
| Overcoat thickness (nm) | 25.5 | 40.5 | 27.1 | 45.2 | 21.5 | 39.1 | 28.6 | 50.1 |
| Luminous reflectance (RL) (%) | 19 | 24.6 | 18.3 | 24.4 | 15.4 | 22.6 | 16.7 | 24.5 |
| Hunter value in reflecion a | −1.7 | −1.1 | −3.1 | −3.7 | −0.7 | −0.9 | −1.1 | −4.0 |
| Hunter value in reflection b | −4.6 | −3.7 | −7.1 | −5.3 | −4.4 | −4.7 | −9.7 | −3.2 |
| Colour purity in reflection (%) | 9.3 | 6.5 | 14.8 | 10.7 | 9.0 | 8.0 | 17.7 | 8.0 |
| $\lambda_D$ in reflection (nm) | 481.9 | 481.1 | 482.4 | 484.4 | 479.4 | 480.0 | 478.8 | 487.1 |
| Luminous transmittance (TL) (%) | 66.7 | 62.4 | 63.2 | 59.1 | 48.6 | 46.0 | 42.2 | 37.7 |
| Solar factor (FS) (%) | 61.7 | 58.8 | 57.4 | 54.7 | 50.6 | 48.9 | 45.8 | 41.8 |
| Selectivity (TL/FS) | 1.08 | 1.06 | 1.10 | 1.08 | 0.96 | 0.94 | 0.92 | 0.90 |

|  | Comparative examples | | | |
|---|---|---|---|---|
|  | C7 | C8 | C9 | C10 |
| Undercoat thickness (nm) | 70 | 70 | 70 | 70 |
| Main layer thickness (nm) | 300 | 413.6 | 313.3 | 391.2 |
| Luminous reflectance (RL) (%) | 9.8 | 9.5 | 9.5 | 9.2 |
| Hunter value in reflection a | −2.9 | 1.9 | −4.1 | 3.1 |
| Hunter value in reflection b | −2.8 | −3.0 | −1.4 | −2.3 |
| Colour purity in reflection (%) | 9.7 | 5.7 | 8.4 | 6.8 |
| $\lambda_D$ in reflection (nm) | 486.1 | −566.7 | 490.7 | −550.8 |
| Luminous transmittance (TL) (%) | 74.5 | 70.2 | 52.8 | 46.2 |
| Solar factor (FS) (%) | 67.7 | 63.2 | 54.4 | 49.7 |
| Selectivity (TL/FS) | 1.10 | 1.11 | 0.97 | 0.93 |

What is claimed is:

1. A coated transparent substrate, comprising, in order from the substrate:
   an undercoat layer;
   a pyrolytically-formed main coating layer which comprises oxide of tin; and
   an outer reflective layer which has a refractive index ranging from 2.0 to 2.8, so that the coated transparent substrate has a luminous reflectance (RL) of more than 10%.

2. The coated transparent substrate as claimed in claim 1, wherein the outer reflective layer contains at least one oxide selected from the group consisting of nickel, tin, titanium, zinc and zirconium.

3. The coated transparent substrate as claimed in claim 1, wherein the outer reflective layer comprises titanium oxide.

4. The coated transparent substrate as claimed in claim 3, wherein the outer reflective layer further comprises tin oxide.

5. The coated transparent substrate as claimed in claim 4, wherein the outer reflective layer comprises at least 50% by volume of tin oxide and at least 30% by volume of titanium oxide.

6. The coated transparent substrate as claimed in claim 4, wherein the outer reflective layer has a geometric thickness ranging from 40 to 75 nm.

7. The coated transparent substrate as claimed in claim 6, wherein the outer reflective layer has a thickness ranging from 60 to 70 nm.

8. The coated transparent substrate as claimed in claim 1, wherein the main coating has a Sb/Sn molar ratio which ranges from 0.01 to 0.5.

9. The coated transparent substrate as claimed in claim 8, wherein the Sb/Sn molar ratio ranges from 0.03 to 0.21.

10. The coated transparent substrate as claimed in claim 1, wherein the main coating layer further comprises antimony and an additive which is at least one element selected from the group consisting of aluminum, chromium, cobalt, iron, manganese, magnesium, nickel, titanium, vanadium, zinc and zirconium.

11. The coated transparent substrate as claimed in claim 10, wherein the additive is selected from the group consisting of chromium, iron and magnesium.

12. The coated transparent substrate as claimed in claim 1, wherein the undercoat layer comprises silicon oxide.

13. The coated transparent substrate as claimed in claim 1, wherein the undercoat layer comprises alumina.

14. The coated transparent substrate as claimed in claim 1, wherein the undercoat layer has a geometric thickness which ranges from 60 to 75 nm.

15. The coated transparent substrate as claimed in claim 1, wherein the undercoat layer imparts to the coated transparent substrate a tint in reflection which is more neutral than would be obtained without the undercoat layer.

16. The coated transparent substrate as claimed in claim 1, wherein the coating stack further comprises an intermediate layer positioned between the main coating layer and the outer reflective layer.

17. The coated transparent substrate as claimed in claim 16, wherein the intermediate layer comprises one of aluminium oxide or silicon oxide.

18. The coated substrate as claimed in claim 1, having a luminous transmittance (TL) of at least 60%.

19. The coated transparent substrate as claimed in claim 1, having a luminous reflectance (RL) of at least 15%.

20. The coated transparent substrate as claimed in claim 1, having a maximum luminous reflectance (RL) of 25%.

21. The coated transparent substrate as claimed in claim 20, wherein the maximum luminous reflectance (RL) is 20%.

22. A glazing panel comprising a coated transparent substrate as claimed in claim 1.

23. The glazing panel as claimed in claim 22, comprising: at least one additional substrate sheet.

24. The glazing panel as claimed in claim 22, which has a structure of a glazing panel for a building.

25. The glazing panel as claimed in claim 22 which has a structure of a glazing panel for a vehicle window.

26. The coated transparent substrate as claimed in claim 1, wherein the main coating layer has a geometric thickness of at least 250 nm.

27. The coated transparent substrate as claimed in claim 1, wherein the outer reflective layer has a geometric thickness ranging from 30 to 150 nm.

28. The coated transparent substrate as claimed in claim 1, wherein the main coating layer further comprises antimony.

29. The coated transparent substrate as claimed in claim 1, wherein the undercoat layer imparts to the coated transparent substrate a more neutral tint in reflection.

30. The coated transparent substrate as claimed in claim 1, having a selectivity (TL/FS) greater than 1.00.

31. The coated transparent substrate as claimed in claim 1, having a colour in reflection defined by a Hunter value a between 0 and −4.0.

32. The coated transparent substrate as claimed in claim 1, having a colour in reflection defined by a Hunter value b between −5.3 and −1.5.

33. The coated transparent substrate as claimed in claim 1, having a colour in reflection defined by a Hunter value a between 0 and −2 and a Hunter value b between −4 and −2.

34. The coated transparent substrate as claimed in claim 1, having a purity in reflection of not greater than 14.8%.

35. The coated transparent substrate as claimed in claim 1, having a purity in reflection of less than 10%.

36. A transparent substrate carrying a coating stack, the coating stack comprising, in order from the substrate:
   an undercoat layer imparting to the coated transparent substrate a more neutral tint in reflection,
   a pyrolytically-formed main coating layer comprising oxide of tin, and
   an outer reflective layer having a geometric thickness ranging from 30 to 150 nm and
   a refractive index ranging from 2.0 to 2.8, so that the coated transparent substrate has a luminous reflectance (RL) of more than 10%.

37. The coated transparent substrate as claimed in claim 36, wherein the outer reflective layer consists essentially of titanium oxide.

38. The coated transparent substrate as claimed in claim 36, wherein the coated transparent substrate has a colour in reflection defined by a Hunter value a between 0 and −3.7 and a Hunter value b between −5.3 and −2 and having a purity in reflection not greater than 10.7%.

39. A transparent substrate carrying a coating stack, the coating stack comprising, in order from the substrate:
   an undercoat layer,
   a pyrolytically-formed main coating layer comprising oxide of tin, and
   an outer reflective layer having a geometric thickness ranging from 30 to 150 nm and
   a refractive index ranging from 2.0 to 2.8, so that the coated transparent substrate has a luminous reflectance (RL) of more than 10%, has a colour in reflection defined by a Hunter value a between 0 and −3.7 and a Hunter value b between −5.3 and −2 and has a purity in reflection not greater than 10.7%.

40. The coated transparent substrate as claimed in claim 39, wherein the outer reflective layer consists essentially of titanium oxide.

* * * * *